(12) United States Patent
Chen et al.

(10) Patent No.: US 10,123,389 B2
(45) Date of Patent: Nov. 6, 2018

(54) LIGHT DEVICE DERIVING CONDITION OF STORAGE CIRCUIT

(71) Applicant: PHILIPS LIGHTING HOLDING B.V., Eindhoven (NL)

(72) Inventors: Hongxin Chen, Shanghai (CN); Hong Chen, Shanghai (CN)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/549,259

(22) PCT Filed: Feb. 9, 2016

(86) PCT No.: PCT/EP2016/052746
§ 371 (c)(1),
(2) Date: Aug. 7, 2017

(87) PCT Pub. No.: WO2016/128413
PCT Pub. Date: Aug. 18, 2016

(65) Prior Publication Data
US 2018/0035511 A1    Feb. 1, 2018

(30) Foreign Application Priority Data

Feb. 10, 2015  (WO) ................ PCT/CN2015/072640
Mar. 12, 2015  (EP) .................................... 15158726

(51) Int. Cl.
*H05B 33/08* (2006.01)
*H05B 41/04* (2006.01)
(Continued)

(52) U.S. Cl.
CPC ..... *H05B 33/0887* (2013.01); *G01R 27/2605* (2013.01); *G01R 31/028* (2013.01);
(Continued)

(58) Field of Classification Search
None
See application file for complete search history.

(56) References Cited

U.S. PATENT DOCUMENTS 5,804,973 A    9/1998  Shinohara et al.
2004/0056643 A1  3/2004  Loef et al.
(Continued)

FOREIGN PATENT DOCUMENTS

JP    2012060814 A    3/2012
WO    2013110027 A1    7/2013

*Primary Examiner* — Dedei K Hammond

(57) ABSTRACT

A device for providing power to a light arrangement (1) having a current conducting state and a current blocking state. The device comprises a storage circuit (2) with a capacitor (21) coupled to the light arrangement (1) and a resistor (22) located in parallel to the capacitor, a first determination circuit (3) for determining the state of the lighting arrangement, a second determination circuit (4) for, in the current blocking state, determining points of two discharging curves of the storage circuit, a derivation circuit (5) for deriving a condition of the storage circuit, such as life-end, from the discharging curves, a switch circuit (6) comprising an element (61), wherein the switch circuit is configured to switch the element (61) in parallel to the capacitor (21), whereby a first discharging curve is determined with the element being disconnected from the capacitor and a second discharging curve is determined with the element being connected to the capacitor, the capacitor discharging via both the resistor (22) and the element (61). The element (61) may comprise a resistor, a capacitor or an inductor.

14 Claims, 4 Drawing Sheets

(51) Int. Cl.
  *G01R 27/26* (2006.01)
  *G01R 31/02* (2006.01)
  *H05B 41/288* (2006.01)
  *H05B 41/292* (2006.01)
  *G01R 31/26* (2014.01)

(52) U.S. Cl.
  CPC ..... *H05B 33/0884* (2013.01); *H05B 41/2886* (2013.01); *H05B 41/2923* (2013.01); *H05B 41/2926* (2013.01); *G01R 31/2633* (2013.01); *G01R 31/2635* (2013.01)

(56) References Cited

U.S. PATENT DOCUMENTS

| | | |
|---|---|---|
| 2008/0030143 A1 | 2/2008 | Goriki et al. |
| 2009/0072839 A1 | 3/2009 | Kim et al. |
| 2010/0295554 A1 | 11/2010 | Alho |
| 2011/0133757 A1 | 6/2011 | Chae et al. |
| 2011/0285526 A1 | 11/2011 | Tanaka et al. |
| 2014/0368204 A1* | 12/2014 | Siessegger ......... H05B 33/0803 324/414 |

* cited by examiner

LIGHT DEVICE DERIVING CONDITION OF STORAGE CIRCUIT

CROSS-REFERENCE TO PRIOR APPLICATIONS

This application is the U.S. National Phase application under 35 U.S.C. § 371 of International Application No. PCT/EP2016/052746, filed on Feb. 9, 2016 which claims the benefit of Chinese Patent Application No. PCT/CN2015/072640, filed on Feb. 10, 2015 and European Patent Application No. 15158726.8, filed on Mar. 12, 2015. These applications are hereby incorporated by reference herein.

FIELD OF THE INVENTION

The invention relates to a device for providing power to a light arrangement for emitting light. The light arrangement is configured to be in a current conducting state or in a current blocking state. The invention further relates to a method for operating a device.

Examples of such a device are lamp drivers. Examples of such a light arrangement are light emitting diode circuits.

BACKGROUND OF THE INVENTION

US 2008/0030143 A1 discloses a discharge lamp lighting device with circuits for annunciating a life-end of a smoothing capacitor. The smoothing capacitor is located between an output of a power supply shutoff section and an input of an inverter main circuit. A discharge lamp is connected to an output of the inverter main circuit.

WO2013110027 disclose degradation of the output capacitor is determined using discharge current of the output capacitor as a function of time.

SUMMARY OF THE INVENTION

U.S. Pat. No. 5,804,973 discloses using one voltage curve of discharging capacitor to detect the deterioration of capacitor. A drawback is in essence this prior art differentiate the discharging voltage to calculate the time constant of the capacitor so as to qualitatively determine whether the capacitor has deteriorated, without calculating the absolute capacity of the capacitor.

It is an object of the invention to provide an improved device and an improved apparatus which is more accurate and quantitative. It is a further object of the invention to provide an improved method.

According to a first aspect, a device is provided for providing power to a light arrangement for emitting light, which light arrangement is configured to be in a current conducting state or in a current blocking state, the device comprising:
  a storage circuit coupled to the light arrangement, the storage circuit comprising a capacitance and a resistance located in parallel to the capacitance,
  a first determination circuit configured to determining whether the light arrangement is in the current conducting state or in the current blocking state,
  a second determination circuit configured to determine in the current blocking state of the light arrangement points of a discharging curve of the storage circuit, and
  a derivation circuit configured to derive from the discharging curve a condition of the storage circuit;

wherein the device further comprises:
  a switch circuit configured to switch an element in parallel to the capacitance, and wherein
  the points of the discharging curve of the storage circuit comprise first points of a first discharging curve of the storage circuit determined for the capacitance being disconnected from the element and discharging via the resistance without the element, and
  the points of the discharging curve of the storage circuit comprise second points of a second discharging curve of the storage circuit determined for the capacitance being connected to the element and discharging via both the resistance and the element.

The device provides power to a light arrangement for emitting light. The light arrangement is configured to be in current conducting states and current blocking states, which states are alternating states: a current conducting state is followed by a current blocking state, and vice versa. In the current conducting state, the light arrangement can conduct a current signal, and it can emit light. In the current blocking state, the light arrangement blocks the current signal, and it does not emit light. The device comprises a storage circuit coupled to the light arrangement. The storage circuit comprises a capacitance for storing energy, for example for smoothing fluctuations in an input signal presented to the light arrangement. The device further comprises a first determination circuit for determining the light arrangement being in the current conducting state or in the current blocking state, and a second determination circuit for determining points of a discharging curve of the storage circuit in the current blocking state of the light arrangement. The device further comprises a derivation circuit for deriving a condition of the storage circuit from the discharging curve.

An operation of the device is as follows. When the feeding of the light arrangement is started, power is provided to the capacitance. The capacitance is charged, and no power is provided to the light arrangement, that is in the current blocking state. As soon as the capacitance has been charged to a predefined extent, the light arrangement goes into the current conducting state, and from that moment on, the power is provided to a combination of the capacitance and the light arrangement. When the feeding of the light arrangement is ended, the power is no longer provided to the capacitance and to the light arrangement. The capacitance is then discharged, via its internal or external resistance as well as via the light arrangement, that is still in the current conducting state. As soon as the capacitance has been discharged to a predefined extent, the light arrangement goes into the current blocking state, and the capacitance is no longer discharged via the light arrangement. From that moment on, the capacitance is further discharged via its internal or external resistance. The device determines this moment, by determining the light arrangement having entered the current blocking state. Then the device determines points of the discharging curve of the storage circuit, while the capacitance is being discharged via its internal or external resistance only. Then the device derives from the discharging curve the condition of the storage circuit, for example by comparing (parts of) the discharging curve with (parts of) a previously determined discharging curve.

As a result, the condition of the storage circuit, such as for example the life-end of the smoothing capacitor, can be derived, without the storage circuit needing to be located between the output of the power supply shutoff section and the input of the inverter main circuit. The storage circuit can remain coupled to the light arrangement, without the light arrangement disturbing a determination of the points of the discharging curve of the storage circuit, owing to the fact that the points of the discharging light arrangement are being determined after the light arrangement has gone into the current blocking state. In other words, the condition of the storage circuit can be derived, without needing to isolate the storage circuit from the light arrangement. This is a great technical advantage.

The condition of the storage circuit may be derived from the discharging curve by using all determined points, by using only some of the determined points, by using a combination of some or all determined points and other points of the discharging curve, or by using only the other points. These other points of the discharging curve may for example be estimated or calculated at the hand of some or more of the determined points. The device may further comprise a driver for driving the light arrangement. The storage circuit, the first and second determination circuits and/or the derivation circuit may form part of such a driver or not.

By determining two different discharging curves and by for example using a fitting algorithm, a value of the capacitance and a value of its internal or external resistance can be calculated, for a given value of the element. By comparing the values of the capacitance and its internal or external resistance with previously determined values, the condition of the storage circuit can be derived. The switch circuit may form part of a possibly present driver or not. The switch circuit may comprise a switch for said switching and may comprise the element.

An embodiment of the device is defined wherein the respective first and second points are determined in respective current blocking states of the light arrangement separated by at least one current conducting state of the light arrangement. According to a first possibility, after the feeding has ended, the first points of the first discharging curve are being determined, for the capacitance being disconnected from the element. The device waits until the feeding has started and ended again, before the second points of the second discharging curve are being determined, for the capacitance being connected to the element. Or vice versa. So, in this case, the first time it takes two cycles of starting and ending the feeding to determine the condition of the storage circuit.

An embodiment of the device is defined wherein the respective first and second points are determined in one and the same current blocking state of the light arrangement. According to a second possibility, after the feeding has ended, firstly the first points of the first discharging curve are being determined, for the capacitance being connected to the element. Then, in time before the capacitance has been discharged to its full extent, the capacitance is disconnected from the element, and secondly the second points of the second discharging curve are being determined. Or vice versa. So, in this case, it always takes only one cycle of starting and ending the feeding to determine the condition of the storage circuit.

An embodiment of the device is defined wherein the element comprises a resistor, a capacitor or an inductor. Preferably, the element comprises a passive element such as a resistor, a capacitor or an inductor.

An embodiment of the device is defined wherein the condition of the storage circuit comprises a condition of the capacitance and the derivation circuit is configured to calculate the capacity value of the capacitance according to the first and the second discharging curve. Compared with the prior art that only a product of R*C is detected, this embodiment can calculate the absolute capacity value of the capacitance thus is more accurate. A capacitance suffers from deterioration relatively much. An expected lifetime of a light arrangement in the form of a light emitting diode circuit may be 100000 hours, where an expected lifetime of a capacitance may be 10000 hours.

An embodiment of the device is defined wherein the condition of the storage circuit comprises a condition of the resistance or conditions of the capacitance and the resistance and the derivation circuit is configured to calculate: the resistance value of the resistance according to the first and the second discharging curve or the capacity value of the capacitance and the resistance value of the resistance according to the first and the second discharging curve. This resistance may be an internal resistance of the capacitance or an external resistance coupled to the capacitance, such as the internal resistance of the driver circuit, as mentioned before. Compared with the prior art that only a product of R*C is detected, this embodiment can calculate the absolute value of the resistance thus the defect in the driver circuit that influence the internal resistance can also be detected.

An embodiment of the device is defined wherein the condition classifies the storage circuit to be in a good condition or in a bad condition. When being in a good condition, the storage circuit and/or a possibly present driver comprising the storage circuit can be used further on, when being in a bad condition, the storage circuit and/or a possibly present driver comprising the storage circuit may need to be replaced.

An embodiment of the device is defined wherein the device further comprises:

an indication circuit configured to generate in dependence of the condition of the storage circuit an indication signal for indicating the condition to a person.

Preferably, the device may further comprise an indication circuit for in dependence of the condition of the storage circuit generating an indication signal for indicating the condition to a person. This indicating may be performed via the light arrangement, by shortly interrupting the light or modulating the light, or may be performed via another generator or via a man-machine-interface. The indication circuit may form part of a possibly present driver or not.

An embodiment of the device is defined wherein the light arrangement, in the current conducting state, is configured to receive an input signal having an amplitude value equal to or larger than a threshold value, which amplitude value, in the current blocking state of the light arrangement, is smaller than the threshold value. This is a simple embodiment wherein a state of the light arrangement is determined at the hand of detecting an input signal that is presented to the light arrangement. The amplitude value of the input signal may be an instantaneous amplitude value. The input signal received by the light arrangement is the output signal transmitted by the device.

An embodiment of the device is defined wherein the input signal comprises a voltage signal, and wherein the threshold value comprises a threshold voltage value. Preferably, the input signal comprises a voltage signal. But alternatively, the input signal may comprise a current signal.

An embodiment of the device is defined wherein the first determination circuit is configured to compare a voltage amplitude value of the voltage signal with the threshold voltage value. Preferably, the first determination circuit compares the voltage amplitude value of the voltage signal that is presented to the light arrangement with the threshold voltage value. But alternatively, the first determination circuit may compare a current amplitude value of a current signal that is presented to the light arrangement with a threshold current. These amplitude values may be instantaneous amplitude values.

An embodiment of the device is defined wherein the second determination circuit is configured to determine the points of the discharging curve of the storage circuit in the form of voltage amplitude values as a function of time. Preferably, the points of the discharging curve of the storage circuit are instantaneous voltage amplitude values as a function of time. But alternatively, the points of the discharging curve of the storage circuit may be instantaneous current amplitude values as a function of time. However, such instantaneous current amplitude values need to be determined between the capacitance and the resistance, which might be relatively difficult.

According to a second aspect, an apparatus is provided for emitting light comprising a light arrangement (1) for emitting the light and one of the devices as described above. The light arrangement (1) is configured to be in a current conducting state or in a current blocking state.

An embodiment of the apparatus is defined wherein the light arrangement comprises a light emitting diode circuit. A light emitting diode circuit may comprise one or more light emitting diodes of whatever kind and in whatever combination. Other light arrangements having current conducting states and current blocking states are not to be excluded. By adding one or more diodes and/or one or more zener-diodes to an arbitrary light arrangement serially, the arbitrary light arrangement comprising the one or more diodes and/or the one or more zener-diodes is given a current conducting state and a current blocking state.

According to a third aspect, a method is provided for operating a device for providing power to a light arrangement for emitting light, wherein the light arrangement is configured to be in a current conducting state or in a current blocking state, wherein the device comprises a storage circuit coupled to the light arrangement, wherein the storage circuit comprises a capacitance, and wherein the method comprises the steps of:

determining the light arrangement being in the current conducting state or in the current blocking state, determining points of a discharging curve of the storage circuit in the current blocking state of the light arrangement, and deriving a condition of the storage circuit from the discharging curve.

A basic idea is that a state of a light arrangement is to be determined, that only in a current blocking state of the light arrangement points of a discharging curve of a storage circuit are to be determined, and that from the discharging curve a condition of the storage circuit is to be derived.

A problem to provide an improved device has been solved. A further advantage is that the device can be simple, robust and low cost, in addition to the fact that a condition of a storage circuit can be determined without the storage circuit needing to be isolated from the light arrangement.

These and other aspects of the invention will be apparent from and elucidated with reference to the embodiments described hereinafter.

DETAILED DESCRIPTION OF EMBODIMENTS

Figure 1:
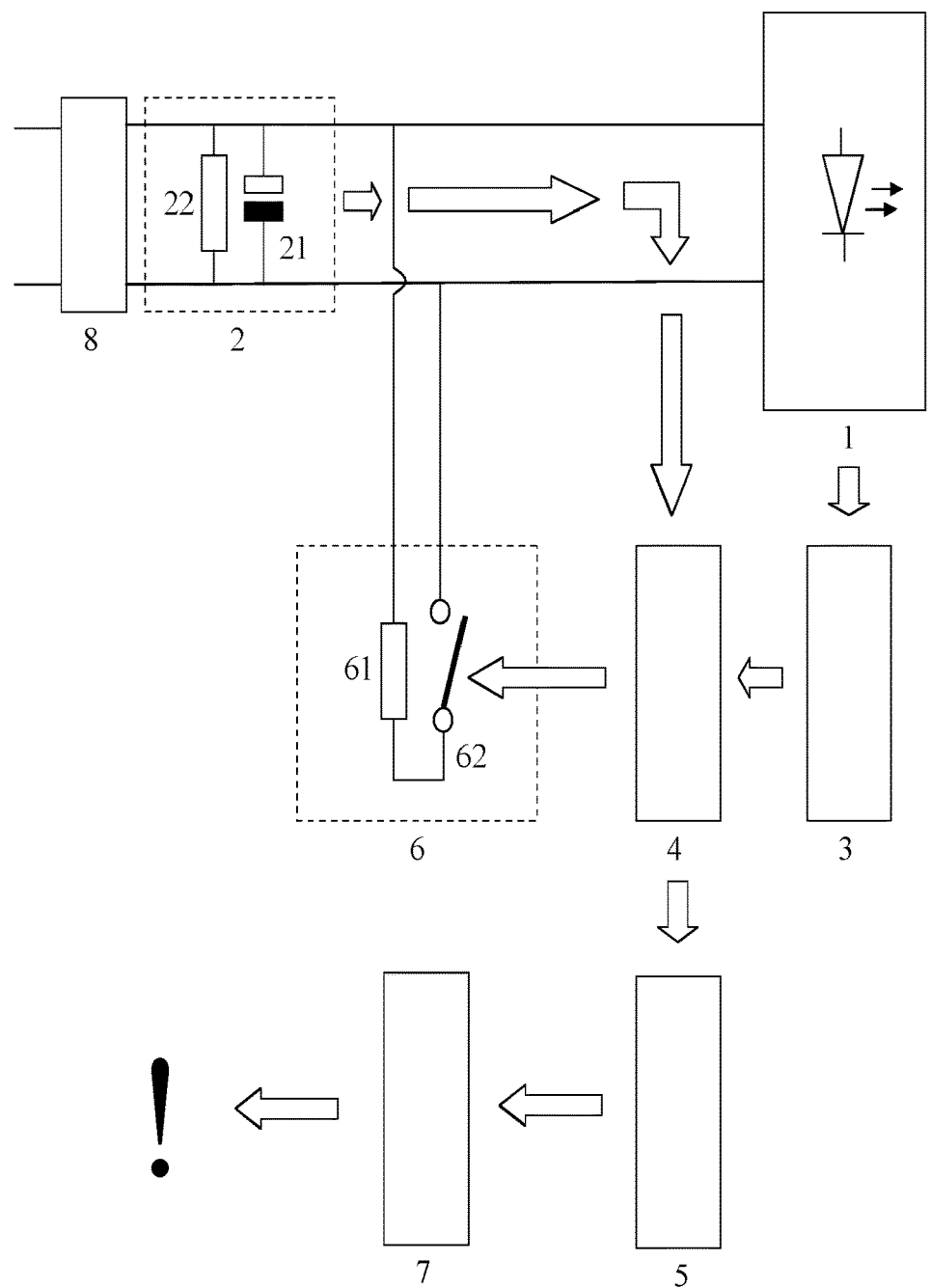
FIG. 1 shows a first embodiment of a device.

In the FIG. 1, a first embodiment of a device is shown. The device 2-5 such as for example a lamp driver for providing power to a light arrangement 1 such as for example a light emitting diode circuit for emitting light. The light arrangement 1 is configured to be in a current conducting state or in a current blocking state. In the current conducting state, the light arrangement 1 can conduct a current signal, and it can emit light. In the current blocking state, the light arrangement 1 blocks the current signal, and it does not emit light.

The device 2-5 comprises a storage circuit 2 electrically coupled to the light arrangement 1. This storage circuit 2 comprises a capacitance 21 and may further comprise a resistance 22 located in parallel to the capacitance 21, here shown as an external resistance, but alternatively, it may be an internal resistance of the capacitance 21.

The device 2-5 comprises a first determination circuit 3 for determining the light arrangement 1 being in the current conducting state or in the current blocking state, a second determination circuit 4 for in the current blocking state of the light arrangement 1 determining points of a discharging curve of the storage circuit 2, and a derivation circuit 5 for deriving from the discharging curve a condition of the storage circuit 2. This condition may for example be a good condition or bad condition, and may comprise a condition of the capacitance 21 or a condition of the resistance 22 or conditions of the capacitance 21 and the resistance 22.

An operation of the device 2-5 is as follows. When the feeding of the light arrangement 1 is started, power is provided to the parallel combination of the capacitance 21 and the resistance 22, via a converter 8 that may form part of the device 2-5 or not. The capacitance 21 is charged, and no power is provided to the light arrangement 1, that is in the current blocking state. As soon as the capacitance 21 has been charged to a first (sufficient) extent, the light arrangement 1 goes into the current conducting state, and from that moment on, the power is provided to a combination of the capacitance 21, the resistance 22 and the light arrangement 1. When the feeding of the light arrangement 1 is ended, the power is no longer provided to the capacitance 21, the resistance 22 and the light arrangement 1. The capacitance 21 is then discharged, via the resistance 22 as well as via the light arrangement 1, that is still in the current conducting state. As soon as the capacitance 21 has been discharged to a second (insufficient) extent, the light arrangement 1 goes into the current blocking state, and the capacitance 21 is no longer discharged via the light arrangement 1. From that moment on, the capacitance 21 is further discharged via the resistance 22 only. The device 2-5 determines this moment, by determining the light arrangement 1 having entered the current blocking state. From that moment on, the device 2-5 determines points of the discharging curve of the storage circuit 2, while the capacitance 21 is being discharged via the resistance 22. Then the device 2-5 derives from the discharging curve the condition of the storage circuit 2, for example by comparing (parts of) the discharging curve with (parts of) a previously determined discharging curve.

As a result, the condition of the storage circuit 2, such as for example a life-end of the capacitance 21, can be derived, without the storage circuit 2 needing to be isolated from the light arrangement 1. This is a great technical advantage. The storage circuit 2 may form part of the converter 8 or not. To be able to determine whether the light arrangement 1 is in the current conducting state or in the current blocking state, the first determination circuit 3 for example measures a voltage amplitude value of a voltage signal present across the light arrangement 1 or for example detects a current amplitude value of a current signal flowing through the light arrangement 1. To be able to, in the current blocking state of the light arrangement 1, determine points of a discharging curve of the storage circuit 2, the second determination circuit 4 for example detects a voltage amplitude value of a voltage signal present across the capacitance 21 or for example detects a current amplitude value of a current signal flowing through the capacitance 21. To be able to derive a condition of the storage circuit 2 from the discharging curve, the derivation circuit 5 for example compares new data with old data or for example performs one or more calculations.

Preferably, the device 2-6 further comprises a switch circuit 6 for switching an element 61 in parallel to the capacitance 21. Such a switch circuit 6 for example comprises a serial combination of the element 61 and a switch 62. The element 61 may be an active element or a passive element, preferably it comprises a resistor, a capacitor or an inductor. The switch 62 may be any kind of switch. By having introduced the switch circuit 6, two different discharging curves can be determined. In that case, the points of the discharging curve of the storage circuit 2 may comprise first points of a first discharging curve of the storage circuit 2 determined for the capacitance 21 being disconnected from the element 61, and the points of the discharging curve of the storage circuit 2 may comprise second points of a second discharging curve of the storage circuit 2 determined for the capacitance 21 being connected to the element 61, or vice versa.

By determining two different discharging curves and by for example using a fitting algorithm, a value of the capacitance 21 and a value of the resistance 22 can be calculated, for a given value of the element 61. By comparing the values of the capacitance 21 and the resistance 22 with previously determined values, the condition of the storage circuit 2 can be derived relatively precisely.

The respective first and second points may be determined in respective current blocking states of the light arrangement 1 separated by at least one current conducting state of the light arrangement 1. After the feeding has ended, the first points of the first discharging curve are determined, for example for the capacitance 21 being disconnected from the element 61. The device 2-6 waits until the feeding has started and ended again, before the second points of the second discharging curve are determined, now for example for the capacitance 21 being connected to the element 61. Or vice versa. So, in this case, the first time it takes two cycles of starting and ending the feeding to determine the condition of the storage circuit 2. This solution may be advantageously used for devices 2-6 that are activated and deactivated relatively often.

The respective first and second points may alternatively be determined in one and the same current blocking state of the light arrangement 1. After the feeding has ended, firstly the first points of the first discharging curve are determined, for example for the capacitance 21 being connected to the element 61. Then, in time before the capacitance 21 has been discharged to its full extent, the capacitance 21 is for example disconnected from the element 61, and secondly the second points of the second discharging curve are determined, now for the capacitance 21 being disconnected from the element 61. Or vice versa. So, in this case, it always takes only one cycle of starting and ending the feeding to determine the condition of the storage circuit 2. This solution may be advantageously used for devices 2-6 that are activated and deactivated relatively sporadically.

Preferably, the device 2-7 further comprises an indication circuit 7 for in dependence of a condition of the storage circuit 2 generating an indication signal for indicating the condition to a person. Here, the indication signal is used to generate an alarm to be supplied to a person optically or acoustically etc. and/or via a wireless or wired connection etc.

Figure 2:
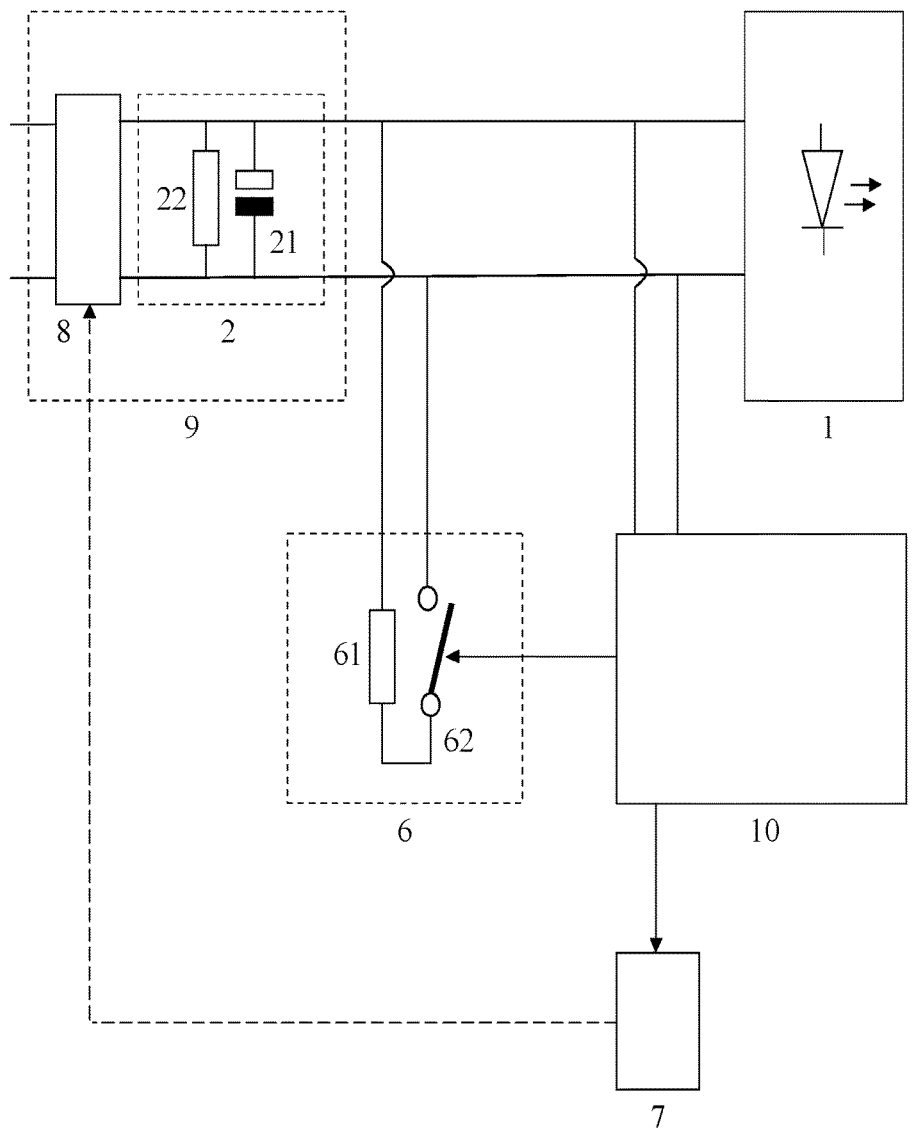
FIG. 2 shows a second embodiment of a device.

In the FIG. 2, a second embodiment of a device is shown. The second embodiment differs from the first embodiment shown in the FIG. 1 in that the first determination circuit 3, the second determination circuit 4 and the derivation circuit 5 are shown in the form of a controller 10 such as for example a microcontroller or a processor etc., in that a driver circuit 9 is present comprising the converter 8 and the storage circuit 2, and in that an output of the indication circuit 7 is coupled to an input of the converter 8.

An input of the controller 10 is coupled to an input of the light arrangement 1. Outputs of the controller 10 are coupled to a control input of the switch circuit 6 for operating the switch 62 and to a control input of the indication circuit 7 for controlling it. The light arrangement 1, in the current conducting state, receives an input signal having an amplitude value equal to or larger than a threshold value, and in the current blocking state of the light arrangement 1, this amplitude value is smaller than the threshold value. In the FIG. 2, this input signal comprises a voltage signal, and the threshold value comprises a threshold voltage value. The first determination circuit 3 in the controller 10 is for example a comparator and configured to compare a voltage amplitude value of the voltage signal with the threshold voltage value. The second determination circuit 4 in the controller 10 is for example a buffer and configured to determine/store the points of the discharging curve of the storage circuit 2 in the form of voltage amplitude values as a function of time.

In the FIG. 2, the indication signal is used to control the converter 8, for generating an alarm to be supplied to a person via the light arrangement 1, or to use the converter 8 as an interface, for sending an alarm to a person via a feeding cable coupled to an input of the converter 8.

Between the controller 10 and the input of the light arrangement 1, a voltage sensor not shown may be present if necessary, or an analog-to-digital-converter not shown may be present if necessary, or one or more of these may form part of the controller 10. In the FIG. 2, one or more of the storage circuit 2, the controller 10, the switch circuit 6 and the indication circuit 7 and parts of each one of these may form part of the driver 9 or not. Alternatively, the indication circuit 7 from the FIG. 2 may be used in the embodiment shown in the FIG. 1, and vice versa. Alternatively, in the FIG. 2, the first determination circuit 3 and/or the second determination circuit 4 may be removed from the controller 10 and shown separately. In the FIG. 1, a controller may replace one or more of the first and second determination circuits 3 and 4 and the derivation circuit 5.

Figure 3:
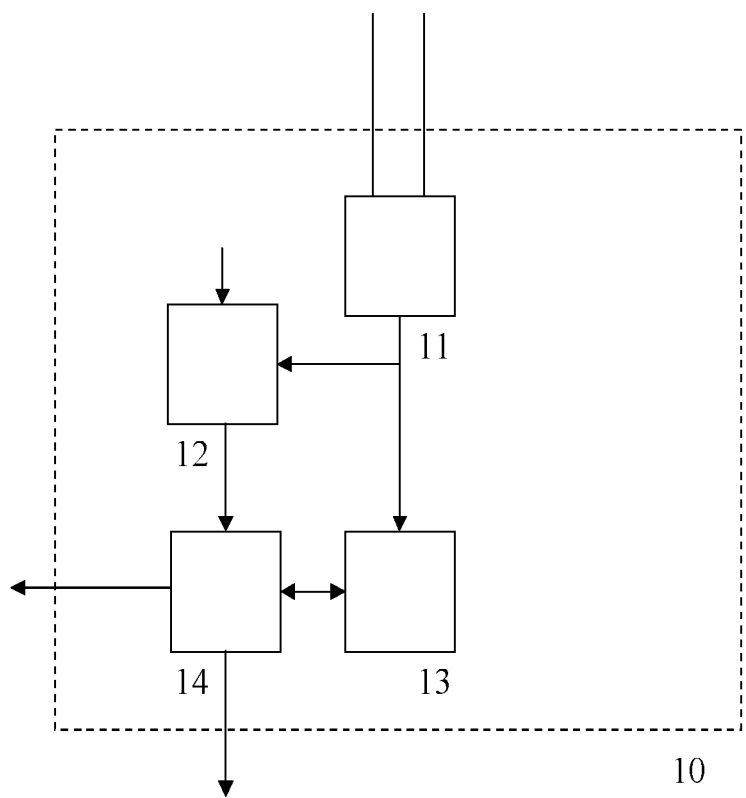
FIG. 3 shows an embodiment of a controller.

In the FIG. 3, an embodiment of a controller 10 is shown. The controller 10 comprises an analog-to-digital-converter 11 or AD-converter 11 having an input coupled to an input of the light arrangement 1, a comparator 12 having a first input coupled to an output of the AD-converter 11 for comparing a digital value of a voltage signal presented to the input of the light arrangement 1 with a threshold voltage value presented to a second input of the comparator 12, a buffer 13 having an input coupled to the output of the AD-converter 11 for storing the digital values of the voltage signal as a function of time, and a processor 14 having an input coupled to an output of the comparator 12 and having an input/output coupled to an input/output of the buffer 13 for establishing a condition of the storage circuit 2. The comparator 12 possibly in combination with the AD-converter 11 forms a first determination circuit, the buffer 13 possibly in combination with the AD-converter 11 forms a second determination circuit, and the processor 14 forms a derivation circuit etc.

Following equation describes the RC discharging curve, where R and C is the capacitance and resistance.

$$v(t) = V_0 e^{-\frac{t}{RC}}$$

Figure 4:
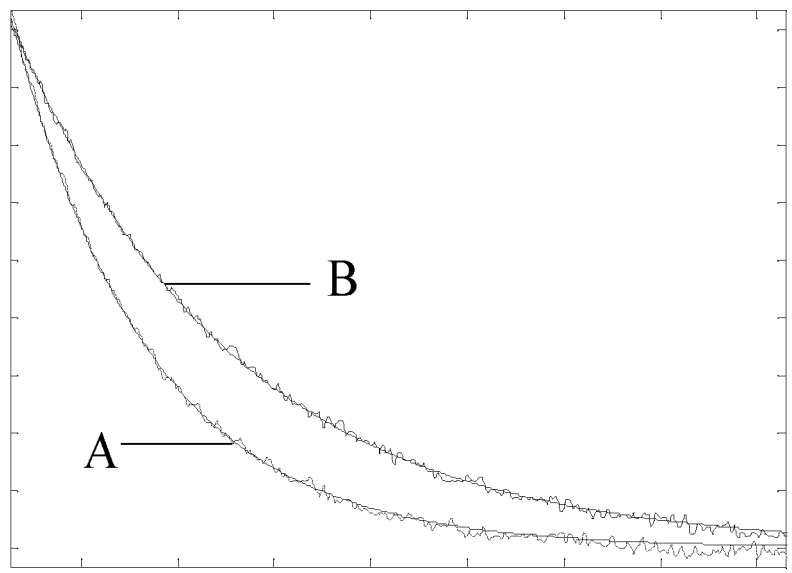
FIG. 4 shows two discharging curves A and B.

In the FIG. 4, two discharging curves A and B are shown (vertical axis: Volt, horizontal axis: Time). The discharging curve A has been recorded for the element 61 in the form of a resistor being connected in parallel to the capacitance 21, and the discharging curve B has been recorded for the element 61 in the form of a resistor being disconnected from the capacitance 21. These recordings have taken place during different current blocking states of the light arrangement 1.

Figure 5:
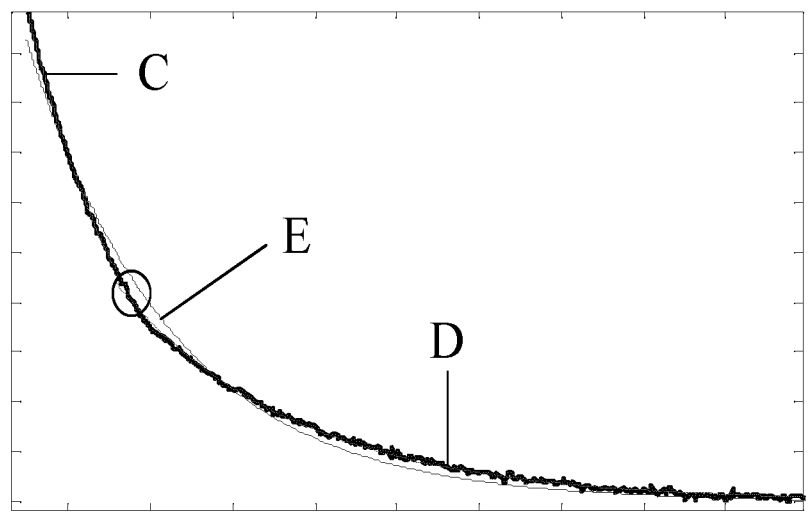
FIG. 5 shows two discharging curves C and D.

In the FIG. 5, two discharging curves C and D are shown (vertical axis: Volt, horizontal axis: Time). The discharging curve C has been recorded for the element 61 in the form of a resistor being connected in parallel to the capacitance 21, and the discharging curve D has been recorded for the element 61 in the form of a resistor being disconnected from the capacitance 21. These recordings have taken place during one and the same current blocking state of the light arrangement 1. Clearly, a combination of the discharging curves C and D deviates from a usual curve E. At a moment in time roughly indicated by the circle, the element 61 is disconnected from the capacitance 21. A good moment in time to switch the element 61 is about halfway a total voltage interval of the two discharging curves C and D, without having excluded other moments in time. Another way to select said moment in time is to switch after a predefined amount of time has elapsed from a start of a first recording etc.

By determining two different discharging curves and by for example using a fitting algorithm, for a given value of the element 61, a value of the capacitance 21 and a value of the resistance 22 can be calculated. By comparing the calculated values with previously determined values, the condition of the storage circuit 2 can be derived.

In case the element 61 comprises a resistor $R_{61}$, and in case a value of the capacitance 21 is indicated by $C_{21}$ and a value of the resistance 22 is indicated by $R_{22}$, and for a first discharging curve it is defined that $P=R_{22}C_{21}$ when the element 61 is disconnected from the capacitance 21 and the resistance 22, and for a second discharging curve it is defined that $Q=R_{61}R_{22}C_{21}/(R_{61}+R_{22})$ when the element 61 is connected to the capacitance 21 and the resistance 22, then it can be derived that $R_{22}=(P-Q) R_{61}/Q$ and it can be derived that $C_{21}=PQ/((P-Q) R_{61})$ whereby P and Q can be derived from the two discharging curves. Similar derivations may be made in case the element 61 comprises a capacitor or an inductor.

First and second units can be coupled indirectly via a third unit and can be coupled directly without the third element being in between. Any (part of an) embodiment shown and/or discussed can be combined with any (part of any) other embodiment shown and/or discussed.

Summarizing, devices for providing power to a light arrangement for emitting light comprise storage circuits 2 with capacitances 21 coupled to the light arrangements 1. The light arrangements 1 has current conducting states and current blocking states. The devices further comprise first determination circuits 3 for determining the states, second determination circuits 4 for in the current blocking states determining points of discharging curves of the storage circuits 2, and derivation circuits 5 for deriving conditions such as life-ends of the storage circuits 2 from the discharging curves, without the storage circuits 2 needing to be isolated from the light arrangements 1. The device may further comprise a switch circuit 6 for switching an element 61 in parallel to the capacitance 21, whereby two discharging curves can be determined, one for the capacitance 21 being disconnected from the element 61 and one for the capacitance 21 being connected to the element 61. The element 61 may comprise a resistor, a capacitor or an inductor.

The apparatus for emitting light comprises a light arrangement (1) for emitting the light and one of the devices as described above. The light arrangement (1) is configured to be in a current conducting state or in a current blocking state. Example of such apparatus is a LED lamp.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. The subject matter for which protection is sought is defined by the claims, wherein in the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for providing power to a light arrangement for emitting light, the light arrangement being configured to be in a current conducting state or in a current blocking state, the device further comprising:
 a storage circuit coupled to the light arrangement, the storage circuit comprising a capacitor and a resistor located in parallel to the capacitance,
 a first determination circuit configured to determine whether the light arrangement is in the current conducting state or in the current blocking state,
 a second determination circuit configured to determine in the current blocking state of the light arrangement points of a discharging curve of the storage circuit, and
 a derivation circuit configured to derive from the discharging curve a condition of the storage circuit;
wherein the device further comprises:
 a switch circuit configured to switch an element in parallel to the capacitor, and wherein
 the points of the discharging curve of the storage circuit comprise first points of a first discharging curve of the storage circuit determined for the capacitor being disconnected from the element and discharging via the resistor without the element, and
 the points of the discharging curve of the storage circuit comprise second points of a second discharging curve of the storage circuit determined for the capacitor being connected to the element and discharging via both the resistor and the element.

2. The device as defined in claim 1, wherein the respective first and second points are determined in respective current blocking states of the light arrangement separated by at least one current conducting state of the light arrangement.

3. The device as defined in claim 1, wherein the respective first and second points are determined in one and the same current blocking state of the light arrangement.

4. The device as defined in claim 1, wherein the element comprises a resistor, a capacitor or an inductor.

5. The device as defined in claim 1, wherein the condition of the storage circuit comprises a condition of the capacitor, and
the derivation circuit is configured to calculate the capacity value of the capacitor according to the first and the second discharging curve.

6. The device as defined in claim 1, wherein the condition of the storage circuit comprises a condition of the resistance or conditions of the capacitance and the resistance and
the derivation circuit is configured to calculate:
the resistance value of the resistor according to the first and the second discharging curve or
the capacity value of the capacitor and the resistor value of the resistor according to the first and the second discharging curve.

7. The device as defined in claim 1, wherein the condition classifies the storage circuit to be in a good condition or in a bad condition.

8. The device as defined in claim 1, wherein the device further comprises:
an indication circuit configured to generate in dependence of the condition of the storage circuit an indication signal for indicating the condition to a person.

9. The device as defined in claim 1, wherein the light arrangement, in the current conducting state, is configured to receive an input signal having an amplitude value equal to or larger than a threshold value, which amplitude value, in the current blocking state of the light arrangement, is smaller than the threshold value.

10. The device as defined in claim 9, wherein the input signal comprises a voltage signal, and wherein the threshold value comprises a threshold voltage value.

11. The device as defined in claim 1, wherein the second determination circuit is configured to determine the points of the discharging curve of the storage circuit in the form of voltage amplitude values as a function of time.

12. The device as defined in claim 1, wherein the light arrangement comprises a light emitting diode circuit.

13. An apparatus for emitting light, the apparatus comprising a light arrangement for emitting the light, the light arrangement being configured to be in a current conducting state or in a current blocking state, the apparatus further comprising the device as claimed in claim 1.

14. A method for operating a device for providing power to a light arrangement for emitting light, wherein the light arrangement is configured to be in a current conducting state or in a current blocking state, wherein the device further comprises a storage circuit coupled to the light arrangement, wherein the storage circuit comprises a capacitance, and a resistor located in parallel to the capacitor, and wherein the method comprises the steps of:
determining the light arrangement being in the current conducting state or in the current blocking state,
determining points of a discharging curve of the storage circuit in the current blocking state of the light arrangement, and
deriving a condition of the storage circuit from the discharging curve;
wherein said step of determining points of a discharging curve comprises:
determining first points of a first discharging curve of the storage circuit in case the capacitor being disconnected from an element and discharging via the resistor without the element, and
determining second points of a second discharging curve of the storage circuit in case the capacitor being connected to the element and discharging via both the resistor and the element.

* * * * *